US010705488B1

(12) United States Patent
Cui et al.

(10) Patent No.: US 10,705,488 B1
(45) Date of Patent: Jul. 7, 2020

(54) SYSTEMS AND METHODS FOR COMPUTER-DETERMINED EFFICIENT BAGGING OF ORDERED ITEMS

(71) Applicant: Coupang, Corp., Seoul (KR)

(72) Inventors: Xiaohua Cui, Shanghai (CN); Zhijun Xu, Shanghai (CN); Rubin Zhao, Shanghai (CN)

(73) Assignee: Coupang Corp., Seoul (KR)

( * ) Notice: Subject to any disclaimer, the term of this patent is extended or adjusted under 35 U.S.C. 154(b) by 0 days.

(21) Appl. No.: 16/576,083

(22) Filed: Sep. 19, 2019

(51) Int. Cl.
| *G05B 11/01* | (2006.01) |
| *G06F 16/245* | (2019.01) |
| *G06Q 30/06* | (2012.01) |
| *G06F 17/50* | (2006.01) |
| *G06F 30/20* | (2020.01) |

(52) U.S. Cl.
CPC .......... *G05B 11/01* (2013.01); *G06F 16/245* (2019.01); *G06F 30/20* (2020.01); *G06Q 30/0635* (2013.01)

(58) Field of Classification Search
None
See application file for complete search history.

(56) References Cited

U.S. PATENT DOCUMENTS

| 3,955,073 | A  | * | 5/1976  | Carew   | G01B 5/0021 |
|           |    |   |         |         | 702/161 |
| 7,063,263 | B2 | * | 6/2006  | Swartz  | G06K 17/00 |
|           |    |   |         |         | 235/462.45 |
| 8,504,413 | B1 | * | 8/2013  | Rowe    | G06Q 10/08 |
|           |    |   |         |         | 705/26.2 |
| 10,192,087 | B2 | * | 1/2019  | Davis   | G06K 9/78 |
| 10,464,106 | B1 | * | 11/2019 | Mo      | B07C 7/005 |
| 2004/0249497 | A1 | * | 12/2004 | Saigh  | E04H 14/00 |
|           |    |   |         |         | 700/216 |
| 2007/0187183 | A1 | * | 8/2007  | Saigh  | E04H 14/00 |
|           |    |   |         |         | 186/53 |
| 2010/0150458 | A1 | * | 6/2010  | Angell | G06F 16/70 |
|           |    |   |         |         | 382/224 |
| 2012/0290424 | A1 | * | 11/2012 | Nelson | G06Q 10/04 |
|           |    |   |         |         | 705/23 |
| 2016/0364634 | A1 | * | 12/2016 | Davis  | G06K 9/78 |
| 2017/0286578 | A1 | * | 10/2017 | Lee    | G06F 17/5009 |
| 2018/0061255 | A1 | * | 3/2018  | Ekambaram | G09B 5/02 |
| 2018/0158016 | A1 | * | 6/2018  | Pandya | G06Q 10/087 |
| 2018/0268664 | A1 | * | 9/2018  | Jones  | G07G 1/0009 |
| 2019/0241298 | A1 | * | 8/2019  | Brooks | A47F 9/043 |

\* cited by examiner

*Primary Examiner* — Ramesh B Patel
(74) *Attorney, Agent, or Firm* — Finnegan, Henderson, Farabow, Garrett & Dunner, LLP

(57) ABSTRACT

The present disclosure provides systems and methods for automated bag packaging, comprising at least one processor; and memory storing comprising: receiving an order comprising at least one item; searching at least one data store to determine one or more properties associated with each item; for each group: performing an optimization process for packaging the at least one item into one or more bags, by: selecting a data structure representing a first bag, the data structure comprising a size of the first bag; iteratively simulating packaging of a largest item of the group into the first bag until all items are packaged in the selected bag; generating at least one set of instructions for packaging the items into the selected bag; and sending the generated instructions to a computer system for display, the instructions including at least one item identifier and one bag identifier.

18 Claims, 12 Drawing Sheets

SYSTEMS AND METHODS FOR COMPUTER-DETERMINED EFFICIENT BAGGING OF ORDERED ITEMS

TECHNICAL FIELD

The present disclosure generally relates to computerized systems and methods for efficient bagging of ordered items (e.g., packaging items into plastic bags). In particular, embodiments of the present disclosure relate to inventive and unconventional systems and methods utilized for handling of incoming orders and preparing said orders for further processing and shipping, automatic packaging determination utilizing boxes, plastic bags, a combination thereof or alternative packaging materials.

BACKGROUND

Efficient packaging operation is a corner stone of any business that relies on shipping products to a consumer. If the packaging operation process is inefficient and takes a significant amount of time, delivery of products to customers may ultimately be delayed further the business will not be able to stay competitive suffering additional shipping expenses. Delayed and/or improperly packaged goods can lead to poor customer satisfaction, and a review from a dissatisfied customer may discourage potential purchases from other customers. The packaging process may be costly to businesses in various ways. For example, business may incur additional shipping costs due to overuse of packaging material. In addition, if one or more products may get damaged due to the improper packaging and will have to be reimbursed. As such, the less efficient the process is the greater the loss for the business.

To mitigate such problems that may arise during packaging operation, conventional systems may sort available boxes by volume and fill them with goods based on the dimensions of the goods. However, taking volume in the account is not enough and damaged and/or improperly packaged goods can lead to poor customer satisfaction. Further conventional systems suffer from overuse of boxes and packaging materials which increases cost. Alternatively the process may be performed using manual labor. However, manually packing each box of products may be time consuming. As such, the time it takes to complete packaging my increase, thereby decreasing profit and increasing the shipment and delivery time of products to customers Prior computerized methods for efficient packaging of ordered items were inefficient, led to overuse of boxes and packaging materials (which increases cost), broken and soiled items (e.g., if a fragile item is stored with a heavy item it may break), and additional shipping expenses. An additional challenge in choosing the best bag efficiently is that unlike boxes they deform in one or two dimensions when you put items into them.

Therefore, there is a need for improved methods and systems for efficient packaging of ordered items. In particular, there is a need for improved systems and methods for efficient packaging of ordered items in bags to optimize for deformations in one or two dimensions when items are packed in them. Based on the iterative simulation of the packaging process to determine optimal packaging for any combination of goods. As such, the efficiency of the packaging operations may increase thereby reducing overall business costs and improving customer satisfaction.

SUMMARY

One aspect of the present disclosure is directed to a system for automated bag packaging, comprising: at least one processor; and at least one non-transitory storage medium comprising instructions that, when executed by the at least one processor, cause the at least one processor to perform steps comprising: receiving, from a remote system, an order comprising at least one item; searching at least one data store to determine one or more properties associated with each item; for each group: performing an optimization process for packaging the at least one item into one or more bags, by: selecting a data structure representing a first bag, the data structure comprising a size of the first bag; iteratively simulating packaging of a largest item of the group into the first bag until all items are packaged in the selected bag; generating at least one set of instructions for packaging the items into the selected bag; and sending the generated instructions to a computer system for display, the instructions including at least one item identifier and one bag identifier.

Another aspect of the present disclosure is directed to a method for automated bag packaging, comprising: receiving, from a remote system, an order comprising at least one item; searching at least one data store to determine one or more properties associated with each item; for each group: performing an optimization process for packaging the at least one item into one or more bags, by: selecting a data structure representing a first bag, the data structure comprising a size of the first bag; iteratively simulating packaging of a largest item of the group into the first bag until all items are packaged in the selected bag; generating at least one set of instructions for packaging the items into the selected bag; and sending the generated instructions to a computer system for display, the instructions including at least one item identifier and one bag identifier.

Yet another aspect of the present disclosure is directed to a method for automated bag packaging wherein iteratively simulating packaging further comprises: determining dimensions of each item; determining the largest item of the group by determining an item with a longest dimension; simulating packing the largest item into the first bag; calculating remaining spaces in the first bag based by subtracting the dimensions of the largest item from the dimensions of the first package; and iteratively simulating packing at least one remaining item in the group into the calculated remaining spaces.

Yet another aspect of the present disclosure is directed to system for automated bag packaging, comprising: receiving, from a remote system, an order comprising at least one item; searching at least one data store to determine one or more properties associated with each item; for each group: performing an optimization process for packaging the at least one item into one or more bags, by: selecting a data structure representing a first bag, the data structure comprising a size of the first bag, wherein: the size of the first bag comprises a width of the first bag (bWidth) and a length of the first bag (bLength); and a maximum virtual height of the first bag (vHeight) is computed as: $vHeight=9+(-2*(bLength+bWidth))+(bLength*bWidth)$; and iteratively simulating packaging of a largest item of the group into the first bag until all items are packaged in the selected bag; generating at least one set of instructions for packaging the items into the selected bag; and sending the generated instructions to a computer system for display, the instructions including at least one item identifier and one bag identifier.

Other systems, methods, and computer-readable media are also discussed herein.

DETAILED DESCRIPTION

Figure 1A:
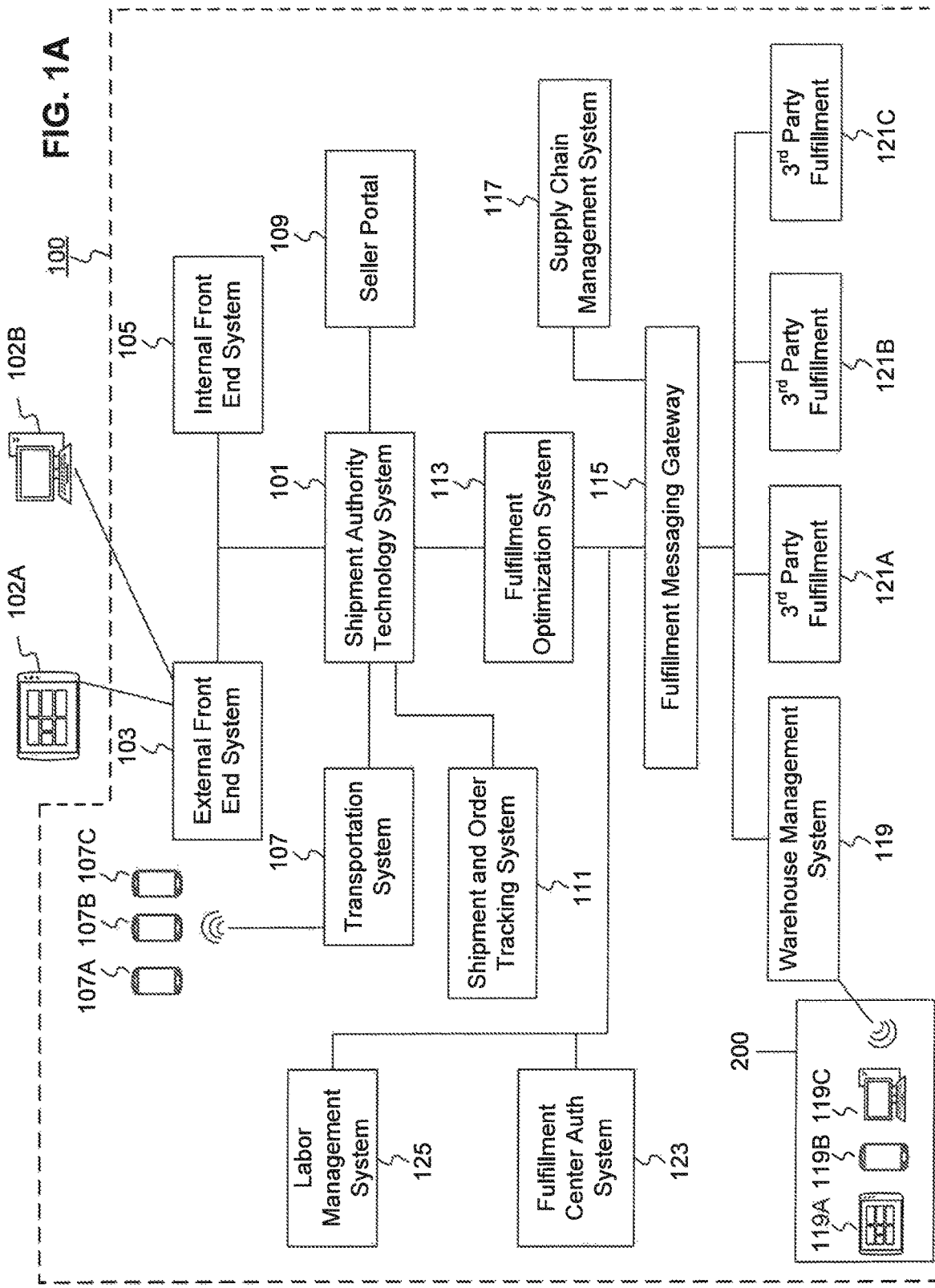
FIG. 1A is a schematic block diagram illustrating an exemplary embodiment of a network comprising computerized systems for communications enabling shipping, transportation, and logistics operations, consistent with the disclosed embodiments.
Figure 1B:
FIG. 1B depicts a sample Search Result Page (SRP) that includes one or more search results satisfying a search request along with interactive user interface elements, consistent with the disclosed embodiments.
Figure 1C:
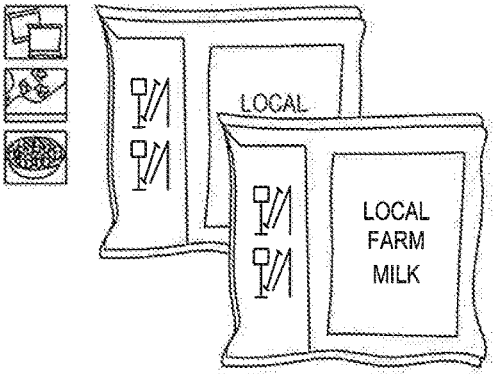
FIG. 1C depicts a sample Single Display Page (SDP) that includes a product and information about the product along with interactive user interface elements, consistent with the disclosed embodiments.

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components and steps illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope of the invention is defined by the appended claims.

Embodiments of the present disclosure are directed to systems and methods configured for efficient packaging of ordered items.

Referring to FIG. 1A, a schematic block diagram 100 illustrating an exemplary embodiment of a system comprising computerized systems for communications enabling shipping, transportation, and logistics operations is shown. As illustrated in FIG. 1A, system 100 may include a variety of systems, each of which may be connected to one another via one or more networks. The systems may also be connected to one another via a direct connection, for example, using a cable. The depicted systems include a shipment authority technology (SAT) system 101, an external front end system 103, an internal front end system 105, a transportation system 107, mobile devices 107A, 107B, and 107C, seller portal 109, shipment and order tracking (SOT) system 111, fulfillment optimization (FO) system 113, fulfillment messaging gateway (FMG) 115, supply chain management (SCM) system 117, warehouse management system 119, mobile devices 119A, 119B, and 119C (depicted as being inside of fulfillment center (FC) 200), $3^{rd}$ party fulfillment systems 121A, 121B, and 121C, fulfillment center authorization system (FC Auth) 123, and labor management system (LMS) 125.

SAT system 101, in some embodiments, may be implemented as a computer system that monitors order status and delivery status. For example, SAT system 101 may determine whether an order is past its Promised Delivery Date (PDD) and may take appropriate action, including initiating a new order, reshipping the items in the non-delivered order, canceling the non-delivered order, initiating contact with the ordering customer, or the like. SAT system 101 may also monitor other data, including output (such as a number of packages shipped during a particular time period) and input (such as the number of empty cardboard boxes received for use in shipping). SAT system 101 may also act as a gateway between different devices in system 100, enabling communication (e.g., using store-and-forward or other techniques) between devices such as external front end system 103 and FO system 113.

External front end system 103, in some embodiments, may be implemented as a computer system that enables external users to interact with one or more systems in system 100. For example, in embodiments where system 100 enables the presentation of systems to enable users to place an order for an item, external front end system 103 may be implemented as a web server that receives search requests, presents item pages, and solicits payment information. For example, external front end system 103 may be implemented as a computer or computers running software such as the Apache HTTP Server, Microsoft Internet Information Services (IIS), NGINX, or the like. In other embodiments, external front end system 103 may run custom web server software designed to receive and process requests from external devices (e.g., mobile device 102A or computer 102B), acquire information from databases and other data stores based on those requests, and provide responses to the received requests based on acquired information.

In some embodiments, external front end system 103 may include one or more of a web caching system, a database, a search system, or a payment system. In one aspect, external front end system 103 may comprise one or more of these systems, while in another aspect, external front end system 103 may comprise interfaces (e.g., server-to-server, database-to-database, or other network connections) connected to one or more of these systems.

An illustrative set of steps, illustrated by FIGS. 1B, 1C, 1D, and 1E, will help to describe some operations of external front end system 103. External front end system 103 may receive information from systems or devices in system 100 for presentation and/or display. For example, external front end system 103 may host or provide one or more web pages, including a Search Result Page (SRP) (e.g., FIG. 1B), a Single Detail Page (SDP) (e.g., FIG. 1C), a Cart page (e.g., FIG. 1D), or an Order page (e.g., FIG. 1E). A user device (e.g., using mobile device 102A or computer 102B) may navigate to external front end system 103 and request a search by entering information into a search box. External front end system 103 may request information from one or more systems in system 100. For example, external front end system 103 may request information from FO System 113 that satisfies the search request. External front end system 103 may also request and receive (from FO System 113) a Promised Delivery Date or "PDD" for each product included in the search results. The PDD, in some embodiments, may represent an estimate of when a package containing the product will arrive at the user's desired location or a date by which the product is promised to be delivered at the user's desired location if ordered within a particular period of time, for example, by the end of the day (11:59 PM). (PDD is discussed further below with respect to FO System 113.)

External front end system 103 may prepare an SRP (e.g., FIG. 1B) based on the information. The SRP may include information that satisfies the search request. For example, this may include pictures of products that satisfy the search request. The SRP may also include respective prices for each product, or information relating to enhanced delivery options for each product, PDD, weight, size, offers, discounts, or the like. External front end system 103 may send the SRP to the requesting user device (e.g., via a network).

A user device may then select a product from the SRP, e.g., by clicking or tapping a user interface, or using another input device, to select a product represented on the SRP. The user device may formulate a request for information on the selected product and send it to external front end system 103. In response, external front end system 103 may request information related to the selected product. For example, the information may include additional information beyond that presented for a product on the respective SRP. This could include, for example, shelf life, country of origin, weight, size, number of items in package, handling instructions, or other information about the product. The information could also include recommendations for similar products (based on, for example, big data and/or machine learning analysis of customers who bought this product and at least one other product), answers to frequently asked questions, reviews from customers, manufacturer information, pictures, or the like.

External front end system 103 may prepare an SDP (Single Detail Page) (e.g., FIG. 1C) based on the received product information. The SDP may also include other interactive elements such as a "Buy Now" button, a "Add to Cart" button, a quantity field, a picture of the item, or the like. The SDP may further include a list of sellers that offer the product. The list may be ordered based on the price each seller offers such that the seller that offers to sell the product at the lowest price may be listed at the top. The list may also be ordered based on the seller ranking such that the highest ranked seller may be listed at the top. The seller ranking may be formulated based on multiple factors, including, for example, the seller's past track record of meeting a promised PDD. External front end system 103 may deliver the SDP to the requesting user device (e.g., via a network).

The requesting user device may receive the SDP which lists the product information. Upon receiving the SDP, the user device may then interact with the SDP. For example, a user of the requesting user device may click or otherwise interact with a "Place in Cart" button on the SDP. This adds the product to a shopping cart associated with the user. The user device may transmit this request to add the product to the shopping cart to external front end system 103.

Figure 1D:
FIG. 1D depicts a sample Cart page that includes items in a virtual shopping cart along with interactive user interface elements, consistent with the disclosed embodiments.
Figure 1E:
FIG. 1E depicts a sample Order page that includes items from the virtual shopping cart along with information regarding purchase and shipping, along with interactive user interface elements, consistent with the disclosed embodiments.

External front end system 103 may generate a Cart page (e.g., FIG. 1D). The Cart page, in some embodiments, lists the products that the user has added to a virtual "shopping cart." A user device may request the Cart page by clicking on or otherwise interacting with an icon on the SRP, SDP, or other pages. The Cart page may, in some embodiments, list all products that the user has added to the shopping cart, as well as information about the products in the cart such as a quantity of each product, a price for each product per item, a price for each product based on an associated quantity, information regarding PDD, a delivery method, a shipping cost, user interface elements for modifying the products in the shopping cart (e.g., deletion or modification of a quantity), options for ordering other product or setting up periodic delivery of products, options for setting up interest payments, user interface elements for proceeding to purchase, or the like. A user at a user device may click on or otherwise interact with a user interface element (e.g., a button that reads "Buy Now") to initiate the purchase of the product in the shopping cart. Upon doing so, the user device may transmit this request to initiate the purchase to external front end system 103.

External front end system 103 may generate an Order page (e.g., FIG. 1E) in response to receiving the request to initiate a purchase. The Order page, in some embodiments, re-lists the items from the shopping cart and requests input of payment and shipping information. For example, the Order page may include a section requesting information about the purchaser of the items in the shopping cart (e.g., name, address, e-mail address, phone number), information about the recipient (e.g., name, address, phone number, delivery information), shipping information (e.g., speed/method of delivery and/or pickup), payment information (e.g., credit card, bank transfer, check, stored credit), user interface elements to request a cash receipt (e.g., for tax purposes), or the like. External front end system 103 may send the Order page to the user device.

The user device may enter information on the Order page and click or otherwise interact with a user interface element that sends the information to external front end system 103. From there, external front end system 103 may send the information to different systems in system 100 to enable the creation and processing of a new order with the products in the shopping cart.

In some embodiments, external front end system 103 may be further configured to enable sellers to transmit and receive information relating to orders.

Internal front end system 105, in some embodiments, may be implemented as a computer system that enables internal users (e.g., employees of an organization that owns, operates, or leases system 100) to interact with one or more systems in system 100. For example, in embodiments where network 101 enables the presentation of systems to enable users to place an order for an item, internal front end system 105 may be implemented as a web server that enables internal users to view diagnostic and statistical information about orders, modify item information, or review statistics relating to orders. For example, internal front end system 105 may be implemented as a computer or computers running software such as the Apache HTTP Server, Microsoft Internet Information Services (IIS), NGINX, or the like. In other embodiments, internal front end system 105 may run custom web server software designed to receive and process requests from systems or devices depicted in system 100 (as well as other devices not depicted), acquire information from databases and other data stores based on those requests, and provide responses to the received requests based on acquired information.

In some embodiments, internal front end system 105 may include one or more of a web caching system, a database, a search system, a payment system, an analytics system, an order monitoring system, or the like. In one aspect, internal front end system 105 may comprise one or more of these systems, while in another aspect, internal front end system 105 may comprise interfaces (e.g., server-to-server, database-to-database, or other network connections) connected to one or more of these systems.

Transportation system 107, in some embodiments, may be implemented as a computer system that enables communication between systems or devices in system 100 and mobile devices 107A-107C. Transportation system 107, in some embodiments, may receive information from one or more mobile devices 107A-107C (e.g., mobile phones, smart phones, PDAs, or the like). For example, in some embodiments, mobile devices 107A-107C may comprise devices operated by delivery workers. The delivery workers, who may be permanent, temporary, or shift employees, may utilize mobile devices 107A-107C to effect delivery of packages containing the products ordered by users. For example, to deliver a package, the delivery worker may receive a notification on a mobile device indicating which package to deliver and where to deliver it. Upon arriving at the delivery location, the delivery worker may locate the package (e.g., in the back of a truck or in a crate of packages), scan or otherwise capture data associated with an identifier on the package (e.g., a barcode, an image, a text string, an RFID tag, or the like) using the mobile device, and deliver the package (e.g., by leaving it at a front door, leaving it with a security guard, handing it to the recipient, or the like). In some embodiments, the delivery worker may capture photo(s) of the package and/or may obtain a signature using the mobile device. The mobile device may send information to transportation system 107 including information about the delivery, including, for example, time, date, GPS location, photo(s), an identifier associated with the delivery worker, an identifier associated with the mobile device, or the like. Transportation system 107 may store this information in a database (not pictured) for access by other systems in system 100. Transportation system 107 may, in some embodiments, use this information to prepare and send tracking data to other systems indicating the location of a particular package.

In some embodiments, certain users may use one kind of mobile device (e.g., permanent workers may use a specialized PDA with custom hardware such as a barcode scanner, stylus, and other devices) while other users may use other kinds of mobile devices (e.g., temporary or shift workers may utilize off-the-shelf mobile phones and/or smart-phones).

In some embodiments, transportation system 107 may associate a user with each device. For example, transportation system 107 may store an association between a user (represented by, e.g., a user identifier, an employee identifier, or a phone number) and a mobile device (represented by, e.g., an International Mobile Equipment Identity (IMEI), an International Mobile Subscription Identifier (IMSI), a phone number, a Universal Unique Identifier (UUID), or a Globally Unique Identifier (GUID)). Transportation system 107 may use this association in conjunction with data received on deliveries to analyze data stored in the database in order to determine, among other things, a location of the worker, an efficiency of the worker, or a speed of the worker.

Seller portal 109, in some embodiments, may be implemented as a computer system that enables sellers or other external entities to electronically communicate with one or more systems in system 100. For example, a seller may utilize a computer system (not pictured) to upload or provide product information, order information, contact information, or the like, for products that the seller wishes to sell through system 100 using seller portal 109.

Shipment and order tracking system 111, in some embodiments, may be implemented as a computer system that receives, stores, and forwards information regarding the location of packages containing products ordered by customers (e.g., by a user using devices 102A-102B). In some embodiments, shipment and order tracking system 111 may request or store information from web servers (not pictured) operated by shipping companies that deliver packages containing products ordered by customers.

In some embodiments, shipment and order tracking system 111 may request and store information from systems depicted in system 100. For example, shipment and order tracking system 111 may request information from transportation system 107. As discussed above, transportation system 107 may receive information from one or more mobile devices 107A-107C (e.g., mobile phones, smart phones, PDAs, or the like) that are associated with one or more of a user (e.g., a delivery worker) or a vehicle (e.g., a delivery truck). In some embodiments, shipment and order tracking system 111 may also request information from warehouse management system (WMS) 119 to determine the location of individual products inside of a fulfillment center (e.g., fulfillment center 200). Shipment and order tracking system 111 may request data from one or more of transportation system 107 or WMS 119, process it, and present it to a device (e.g., user devices 102A and 102B) upon request.

Fulfillment optimization (FO) system 113, in some embodiments, may be implemented as a computer system that stores information for customer orders from other systems (e.g., external front end system 103 and/or shipment and order tracking system 111). FO system 113 may also store information describing where particular items are held or stored. For example, certain items may be stored only in one fulfillment center, while certain other items may be stored in multiple fulfillment centers. In still other embodiments, certain fulfillment centers may be designed to store only a particular set of items (e.g., fresh produce or frozen products). FO system 113 stores this information as well as associated information (e.g., quantity, size, date of receipt, expiration date, etc.).

FO system 113 may also calculate a corresponding PDD (promised delivery date) for each product. The PDD, in some embodiments, may be based on one or more factors. For example, FO system 113 may calculate a PDD for a product based on a past demand for a product (e.g., how many times that product was ordered during a period of time), an expected demand for a product (e.g., how many customers are forecast to order the product during an upcoming period of time), a network-wide past demand indicating how many products were ordered during a period of time, a network-wide expected demand indicating how many products are expected to be ordered during an upcoming period of time, one or more counts of the product stored in each fulfillment center 200, which fulfillment center stores each product, expected or current orders for that product, or the like.

In some embodiments, FO system 113 may determine a PDD for each product on a periodic basis (e.g., hourly) and store it in a database for retrieval or sending to other systems (e.g., external front end system 103, SAT system 101, shipment and order tracking system 111). In other embodiments, FO system 113 may receive electronic requests from one or more systems (e.g., external front end system 103, SAT system 101, shipment and order tracking system 111) and calculate the PDD on demand.

Fulfillment messaging gateway (FMG) 115, in some embodiments, may be implemented as a computer system that receives a request or response in one format or protocol from one or more systems in system 100, such as FO system 113, converts it to another format or protocol, and forward it in the converted format or protocol to other systems, such as WMS 119 or $3^{rd}$ party fulfillment systems 121A, 121B, or 121C, and vice versa.

Supply chain management (SCM) system 117, in some embodiments, may be implemented as a computer system that performs forecasting functions. For example, SCM system 117 may forecast a level of demand for a particular product based on, for example, based on a past demand for products, an expected demand for a product, a network-wide past demand, a network-wide expected demand, a count products stored in each fulfillment center 200, expected or current orders for each product, or the like. In response to this forecasted level and the amount of each product across all fulfillment centers, SCM system 117 may generate one or more purchase orders to purchase and stock a sufficient quantity to satisfy the forecasted demand for a particular product.

Warehouse management system (WMS) 119, in some embodiments, may be implemented as a computer system that monitors workflow. For example, WMS 119 may receive event data from individual devices (e.g., devices 107A-107C or 119A-119C) indicating discrete events. For example, WMS 119 may receive event data indicating the use of one of these devices to scan a package. As discussed below with respect to fulfillment center 200 and FIG. 2, during the fulfillment process, a package identifier (e.g., a barcode or RFID tag data) may be scanned or read by machines at particular stages (e.g., automated or handheld barcode scanners, RFID readers, high-speed cameras, devices such as tablet 119A, mobile device/PDA 1198, computer 119C, or the like). WMS 119 may store each event indicating a scan or a read of a package identifier in a corresponding database (not pictured) along with the package identifier, a time, date, location, user identifier, or other information, and may provide this information to other systems (e.g., shipment and order tracking system 111).

WMS 119, in some embodiments, may store information associating one or more devices (e.g., devices 107A-107C or 119A-119C) with one or more users associated with system 100. For example, in some situations, a user (such as a part- or full-time employee) may be associated with a mobile device in that the user owns the mobile device (e.g., the mobile device is a smartphone). In other situations, a user may be associated with a mobile device in that the user is temporarily in custody of the mobile device (e.g., the user checked the mobile device out at the start of the day, will use it during the day, and will return it at the end of the day).

WMS 119, in some embodiments, may maintain a work log for each user associated with system 100. For example, WMS 119 may store information associated with each employee, including any assigned processes (e.g., unloading trucks, picking items from a pick zone, rebin wall work, packing items), a user identifier, a location (e.g., a floor or zone in a fulfillment center 200), a number of units moved through the system by the employee (e.g., number of items picked, number of items packed), an identifier associated with a device (e.g., devices 119A-119C), or the like. In some embodiments, WMS 119 may receive check-in and check-out information from a timekeeping system, such as a timekeeping system operated on a device 119A-119C.

$3^{rd}$ party fulfillment (3PL) systems 121A-121C, in some embodiments, represent computer systems associated with third-party providers of logistics and products. For example, while some products are stored in fulfillment center 200 (as discussed below with respect to FIG. 2), other products may be stored off-site, may be produced on demand, or may be otherwise unavailable for storage in fulfillment center 200. 3PL systems 121A-121C may be configured to receive orders from FO system 113 (e.g., through FMG 115) and may provide products and/or services (e.g., delivery or installation) to customers directly. In some embodiments, one or more of 3PL systems 121A-121C may be part of system 100, while in other embodiments, one or more of 3PL systems 121A-121C may be outside of system 100 (e.g., owned or operated by a third-party provider).

Fulfillment Center Auth system (FC Auth) 123, in some embodiments, may be implemented as a computer system with a variety of functions. For example, in some embodiments, FC Auth 123 may act as a single-sign on (SSO) service for one or more other systems in system 100. For example, FC Auth 123 may enable a user to log in via internal front end system 105, determine that the user has similar privileges to access resources at shipment and order tracking system 111, and enable the user to access those privileges without requiring a second log in process. FC Auth 123, in other embodiments, may enable users (e.g., employees) to associate themselves with a particular task. For example, some employees may not have an electronic device (such as devices 119A-119C) and may instead move from task to task, and zone to zone, within a fulfillment center 200, during the course of a day. FC Auth 123 may be configured to enable those employees to indicate what task they are performing and what zone they are in at different times of day.

Labor management system (LMS) 125, in some embodiments, may be implemented as a computer system that stores attendance and overtime information for employees (including full-time and part-time employees). For example, LMS 125 may receive information from FC Auth 123, WMA 119, devices 119A-119C, transportation system 107, and/or devices 107A-107C.

The particular configuration depicted in FIG. 1A is an example only. For example, while FIG. 1A depicts FC Auth system 123 connected to FO system 113, not all embodiments require this particular configuration. Indeed, in some embodiments, the systems in system 100 may be connected to one another through one or more public or private networks, including the Internet, an Intranet, a WAN (Wide-Area Network), a MAN (Metropolitan-Area Network), a wireless network compliant with the IEEE 802.11a/b/g/n Standards, a leased line, or the like. In some embodiments, one or more of the systems in system 100 may be implemented as one or more virtual servers implemented at a data center, server farm, or the like.

Figure 2:
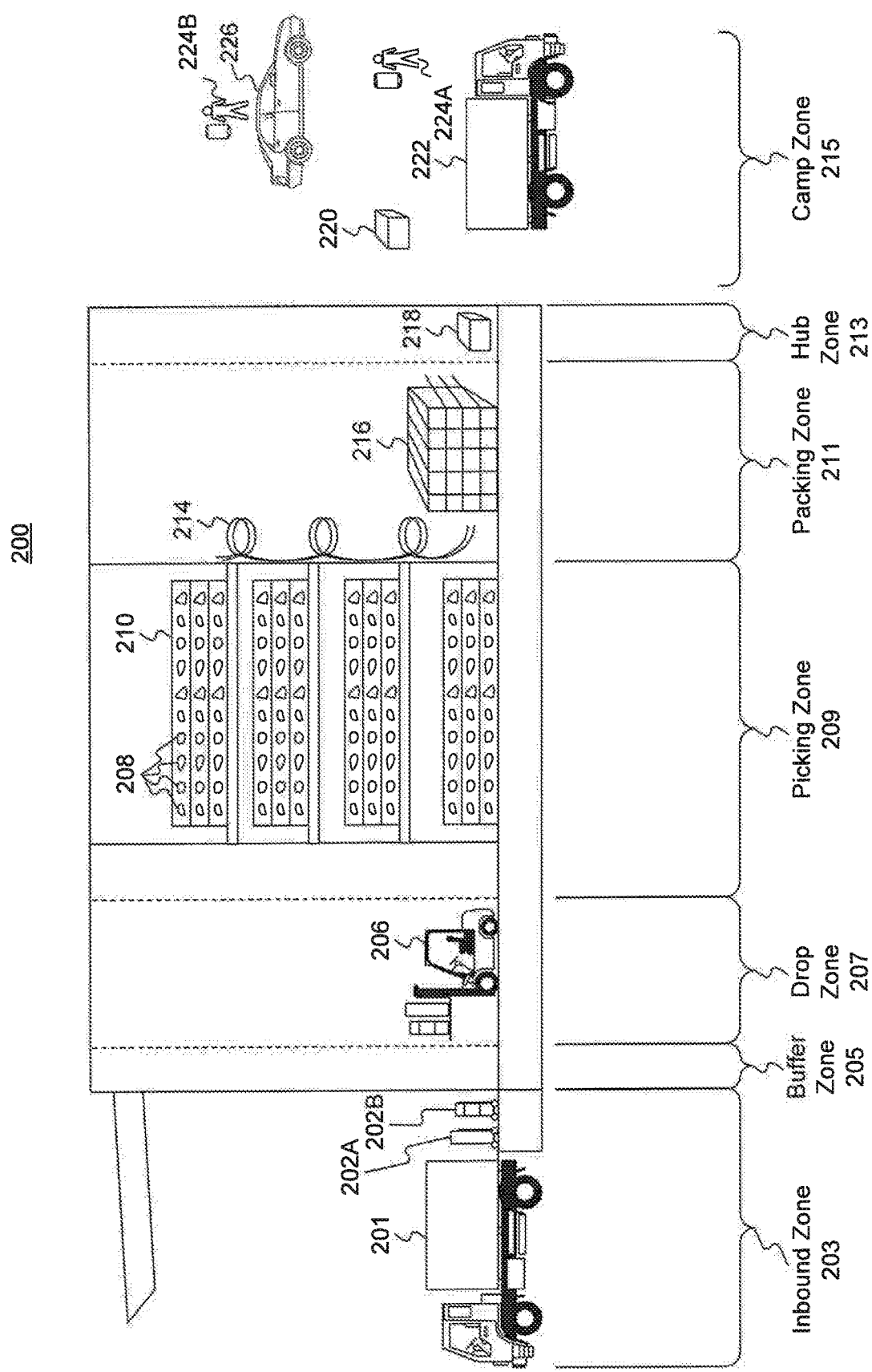
FIG. 2 is a diagrammatic illustration of an exemplary fulfillment center configured to utilize disclosed computerized systems, consistent with the disclosed embodiments.

FIG. 2 depicts a fulfillment center 200. Fulfillment center 200 is an example of a physical location that stores items for shipping to customers when ordered. Fulfillment center (FC) 200 may be divided into multiple zones, each of which are depicted in FIG. 2. These "zones," in some embodiments, may be thought of as virtual divisions between different stages of a process of receiving items, storing the items, retrieving the items, and shipping the items. So while the "zones" are depicted in FIG. 2, other divisions of zones are possible, and the zones in FIG. 2 may be omitted, duplicated, or modified in some embodiments.

Inbound zone 203 represents an area of FC 200 where items are received from sellers who wish to sell products using system 100 from FIG. 1A. For example, a seller may deliver items 202A and 202B using truck 201. Item 202A may represent a single item large enough to occupy its own shipping pallet, while item 202B may represent a set of items that are stacked together on the same pallet to save space.

A worker will receive the items in inbound zone 203 and may optionally check the items for damage and correctness using a computer system (not pictured). For example, the worker may use a computer system to compare the quantity of items 202A and 202B to an ordered quantity of items. If the quantity does not match, that worker may refuse one or more of items 202A or 202B. If the quantity does match, the worker may move those items (using, e.g., a dolly, a handtruck, a forklift, or manually) to buffer zone 205. Buffer zone 205 may be a temporary storage area for items that are not currently needed in the picking zone, for example, because there is a high enough quantity of that item in the picking zone to satisfy forecasted demand. In some embodiments, forklifts 206 operate to move items around buffer zone 205 and between inbound zone 203 and drop zone 207. If there is a need for items 202A or 202B in the picking zone (e.g., because of forecasted demand), a forklift may move items 202A or 202B to drop zone 207.

Drop zone 207 may be an area of FC 200 that stores items before they are moved to picking zone 209. A worker assigned to the picking task (a "picker") may approach items 202A and 202B in the picking zone, scan a barcode for the picking zone, and scan barcodes associated with items 202A and 202B using a mobile device (e.g., device 119B). The picker may then take the item to picking zone 209 (e.g., by placing it on a cart or carrying it).

Picking zone 209 may be an area of FC 200 where items 208 are stored on storage units 210. In some embodiments, storage units 210 may comprise one or more of physical shelving, bookshelves, boxes, totes, refrigerators, freezers, cold stores, or the like. In some embodiments, picking zone 209 may be organized into multiple floors. In some embodiments, workers or machines may move items into picking zone 209 in multiple ways, including, for example, a forklift, an elevator, a conveyor belt, a cart, a handtruck, a dolly, an automated robot or device, or manually. For example, a picker may place items 202A and 202B on a handtruck or cart in drop zone 207 and walk items 202A and 202B to picking zone 209.

A picker may receive an instruction to place (or "stow") the items in particular spots in picking zone 209, such as a particular space on a storage unit 210. For example, a picker may scan item 202A using a mobile device (e.g., device 119B). The device may indicate where the picker should stow item 202A, for example, using a system that indicate an aisle, shelf, and location. The device may then prompt the picker to scan a barcode at that location before stowing item 202A in that location. The device may send (e.g., via a wireless network) data to a computer system such as WMS 119 in FIG. 1A indicating that item 202A has been stowed at the location by the user using device 1196.

Once a user places an order, a picker may receive an instruction on device 119B to retrieve one or more items 208 from storage unit 210. The picker may retrieve item 208, scan a barcode on item 208, and place it on transport mechanism 214. While transport mechanism 214 is represented as a slide, in some embodiments, transport mechanism may be implemented as one or more of a conveyor belt, an elevator, a cart, a forklift, a handtruck, a dolly, a cart, or the like. Item 208 may then arrive at packing zone 211.

Packing zone 211 may be an area of FC 200 where items are received from picking zone 209 and packed into boxes or bags for eventual shipping to customers. In packing zone 211, a worker assigned to receiving items (a "rebin worker") will receive item 208 from picking zone 209 and determine what order it corresponds to. For example, the rebin worker may use a device, such as computer 119C, to scan a barcode on item 208. Computer 119C may indicate visually which order item 208 is associated with. This may include, for example, a space or "cell" on a wall 216 that corresponds to an order. Once the order is complete (e.g., because the cell contains all items for the order), the rebin worker may indicate to a packing worker (or "packer") that the order is complete. The packer may retrieve the items from the cell and place them in a box or bag for shipping. The packer may then send the box or bag to a hub zone 213, e.g., via forklift, cart, dolly, handtruck, conveyor belt, manually, or otherwise.

Hub zone 213 may be an area of FC 200 that receives all boxes or bags ("packages") from packing zone 211. Workers and/or machines in hub zone 213 may retrieve package 218 and determine which portion of a delivery area each package is intended to go to, and route the package to an appropriate camp zone 215. For example, if the delivery area has two smaller sub-areas, packages will go to one of two camp zones 215. In some embodiments, a worker or machine may scan a package (e.g., using one of devices 119A-119C) to determine its eventual destination. Routing the package to camp zone 215 may comprise, for example, determining a portion of a geographical area that the package is destined for (e.g., based on a postal code) and determining a camp zone 215 associated with the portion of the geographical area.

Camp zone 215, in some embodiments, may comprise one or more buildings, one or more physical spaces, or one or more areas, where packages are received from hub zone 213 for sorting into routes and/or sub-routes. In some embodiments, camp zone 215 is physically separate from FC 200 while in other embodiments camp zone 215 may form a part of FC 200.

Workers and/or machines in camp zone 215 may determine which route and/or sub-route a package 220 should be associated with, for example, based on a comparison of the destination to an existing route and/or sub-route, a calculation of workload for each route and/or sub-route, the time of day, a shipping method, the cost to ship the package 220, a PDD associated with the items in package 220, or the like. In some embodiments, a worker or machine may scan a package (e.g., using one of devices 119A-119C) to determine its eventual destination. Once package 220 is assigned to a particular route and/or sub-route, a worker and/or machine may move package 220 to be shipped. In exemplary FIG. 2, camp zone 215 includes a truck 222, a car 226, and delivery workers 224A and 224B. In some embodiments, truck 222 may be driven by delivery worker 224A, where delivery worker 224A is a full-time employee that delivers packages for FC 200 and truck 222 is owned, leased, or operated by the same company that owns, leases, or operates FC 200. In some embodiments, car 226 may be driven by delivery worker 224B, where delivery worker 224B is a "flex" or occasional worker that is delivering on an as-needed basis (e.g., seasonally). Car 226 may be owned, leased, or operated by delivery worker 224B.

Figure 3:
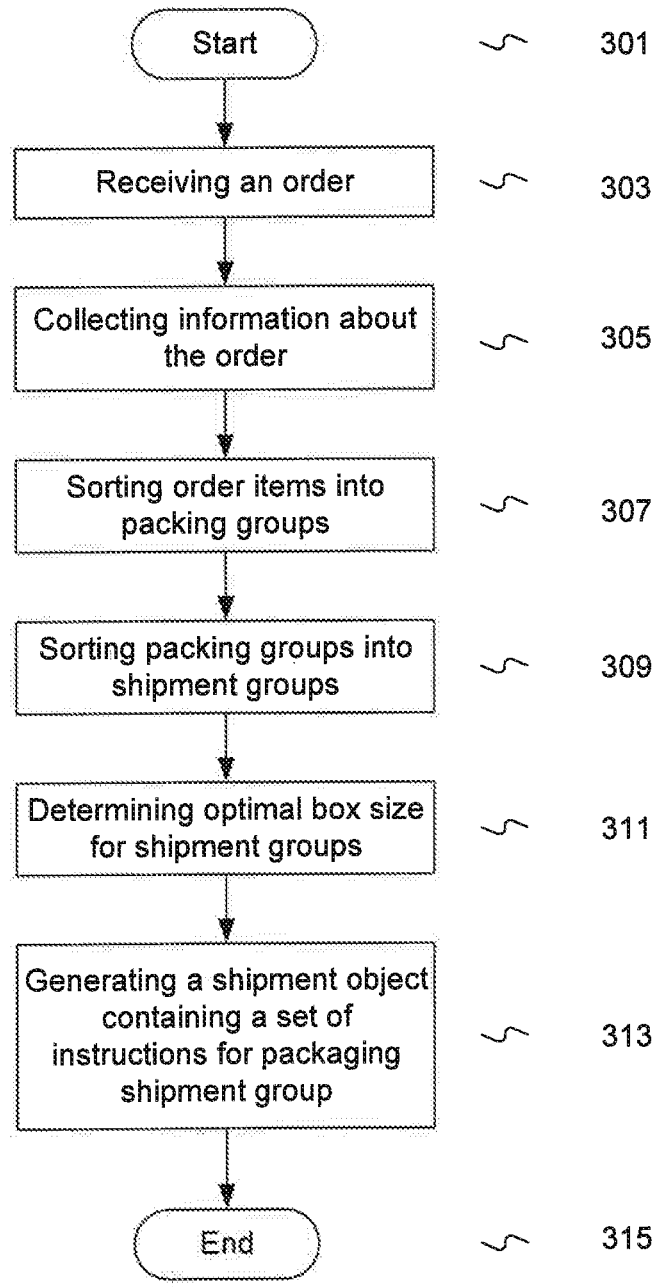
FIG. 3 is a flow chart illustrating an exemplary embodiment of a method for efficient packaging of ordered items, consistent with the disclosed embodiments.

FIG. 3 illustrates an outline of the main process for efficient packaging of ordered items. Process 301 starts at step 303. In step 303, FO system 113 begins with receiving an order. Order may constitute a variety of items, i.e. a mix of consumable and non-consumable goods.

Process 301 then proceeds to step 305. In step 305, FO system 113 begins collecting information about the order. Collected information about the order may comprise a variety of data, i.e. information about the order itself such as quantity of the items in the order, total cost of the ordered items, etc. Additionally information about individual items within the order may be collected. For example dimensions, weight, cost or other specific flags identifying an item. An example of a flag will be fragile, bulky, frozen, normal, etc.

Process 301 then proceeds to step 307. In step 307, FO system 113 may sort ordered items into packing groups 307. Sorting step 307 may be performed based on the information collected in step 305. For example frozen items will be grouped separately from refrigerated items and separately from other normal items. Alternatively items might be sorted based on other collected characteristics such as dimensions, weight, and cost to name a few. Sorting may be performed based on the individual characteristics or on combination thereof.

Process 301 then proceeds to step 309. In step 309, FO system 113 begins sorting packing groups into shipment groups 309. The sorting into shipment groups step 309 is performed based on the preset weight and dimension thresholds that may be preset by a transportation vendor. The sorting into the shipment group step 309 also takes cost into consideration. I.e. if it is cheaper to send two smaller packages instead of one large and heavy the choice will be made to favor cheaper alternative. If multiple shipping vendors are used multiple threshold may be set up to take in to the account difference in cost across all the available vendors.

Process 301 then proceeds to step 311. In step 311, FO system 113 begins a subroutine for determining an optimal box size for each of the shipment groups. In step 311, FO system 113 may select a data structure representing a first package, wherein the data structure may comprise properties of the first package. In step 311 FO system 113 may proceed with iteratively simulating packaging of a largest item of the group into the first package until all items are packaged in the selected package, wherein if the simulating determines that the items in the group do not fit into the selected package the process may attempt to choose a larger package, and iteratively computationally pack the largest item until all items are packed in the larger package. In step 311 FO system 113 may further include various packaging materials in the calculation i.e. boxes, plastic bags, bubble wrap, etc. The process is geared for the optimization on material usage and shipping cost. During the iterative step 311 the FO system 113 may use dimensions of at least one item of the group in determining the largest item of the group for simulating packing the largest item into the first package and further calculating remaining spaces based by subtracting the dimensions of the largest item from the dimensions of the first package and iteratively simulating packing at least one remaining item in the group into the calculated remaining spaces.

Process 301 then proceeds to step 313. In step 313, FO system 113 continues with generating a shipment object containing a set of instructions for packaging shipment group. The set of instructions for packaging shipment group generated by the FO system 113 in step 313 may include combination of the material used and specific dimensions and qualities of the packaging materials. For Example the set of instruction might specify that shipment group will be packaged in a 8$^{15}$/$_{16}$"×5$^{15}$/$_{16}$"×3⅛" box, double wall board (DWB), that some of the items will be packaged in the bubble wrap prior to boxing it up, that remaining empty space will be filled with airbags, and include specific order in which items are designed to fit in the box.

After the shipment object is generated in step 313 the FO system 113 repeats the process in FIG. 3 until all items from the order received in step 303 are packaged. After all the items are packaged the process 301 then proceeds to step 315. In step 315, FO system 113 ends main process, and may restart the process in FIG. 3 if new orders are received.

Figure 4:
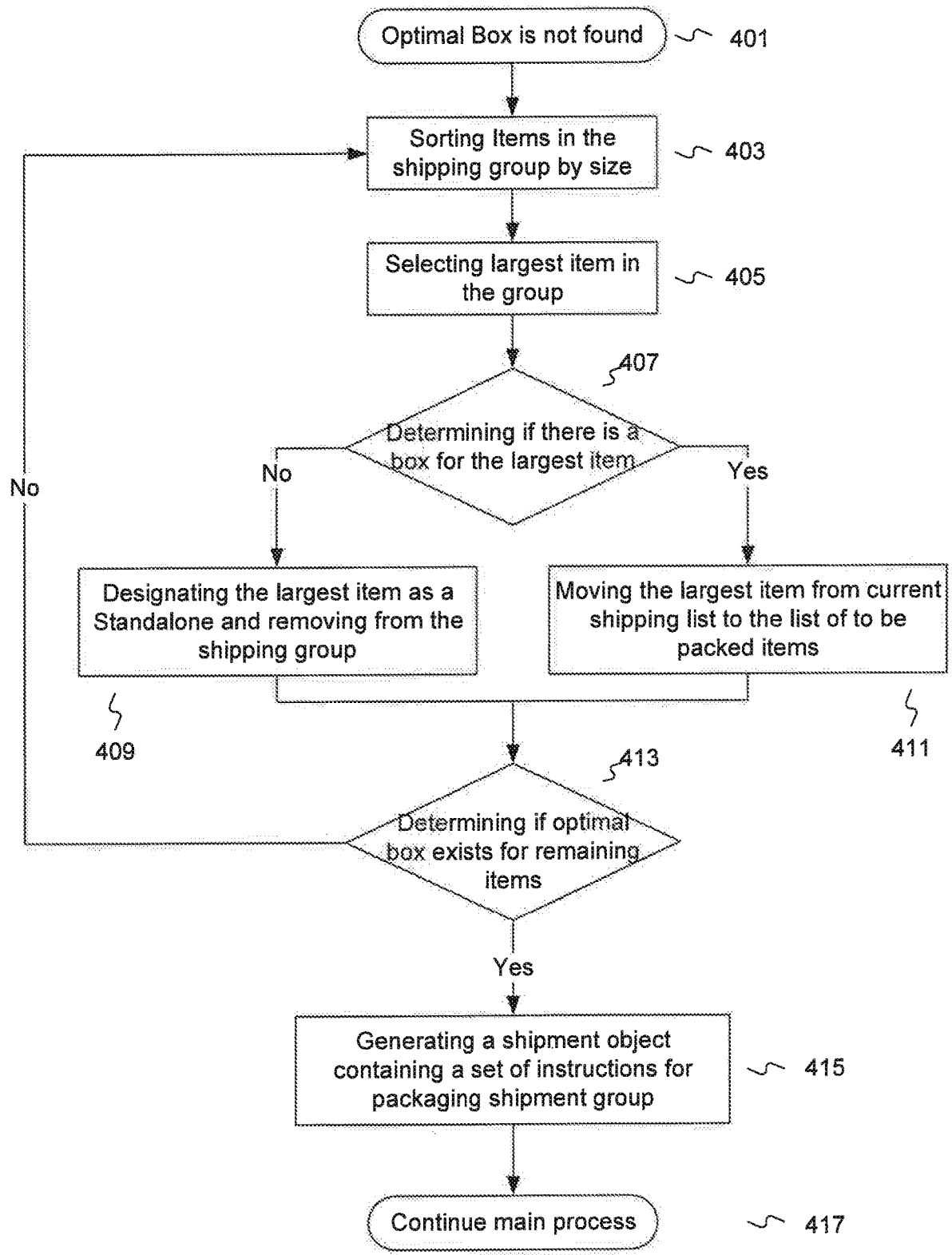
FIG. 4 is a flow chart illustrating an exemplary embodiment of a method for efficient packaging of ordered items in a case when the optimal packaging is not found, consistent with the disclosed embodiments. Method

FIG. 4 illustrates a subroutine 401 of the main process performed by the FO system 113 depicted in FIG. 3. Specifically, in some embodiments, the subroutine is a part of a step 313 for determining the optimal box size for shipment groups but specifically designed for the situation when an optimal box is not found using regular means described above.

If step 313 performed by the FO system 113 did not find an optimal package for the ordered items the subroutine 401 starts at step 403. In step 403, FO system 113 process 401 begins by sorting items in the shipping group by size. After the sorting step 403 the FO system 113 may continue with the step 405, selecting the largest item from the group, wherein the largest item might be determined based on dimensions, weight, or total volume.

Process 401 then proceeds to step 407. In step 407, FO system 113 may determine whether there is a box that will fit the largest item. If there is a box that will accommodate the largest item the FO system 113 continues the process 401 with step 411 by moving the largest item from current shipping list to the list of to be packed items. Alternatively if there no box available that will accommodate the largest item the FO system 113 continues the process 401 with step 409 designating the largest item as a standalone and removing it from the shipping group, wherein standalone items may be packed individually using alternative packaging techniques, e.g. wrapped in packing paper.

Process 401 then proceeds to step 413. In step 413, FO system 113 continues by determining if optimal box exists for remaining items. If optimal box does not exist the FO system 113 repeats the process 401 by returning to step 403. If the optimal box is found the FO system 113 concludes the process 401 by proceeding to step 415. In step 415, FO system 113 generates a shipment object containing a set of instructions for packaging shipment group. (In some embodiments, FO system 113 will generate shipment objects in an identical manner to step 313, described above with respect to FIG. 3.) Process 401 then proceeds to step 417. In step 417, FO system 113 returns to the main process in FIG. 3. The FO system 113 performing the main process described above with respect to FIG. 3 may call on process 401 in each iteration if optimal box is not found for initial grouping of order items until all the items in the order are processed and properly packaged.

Figure 5:
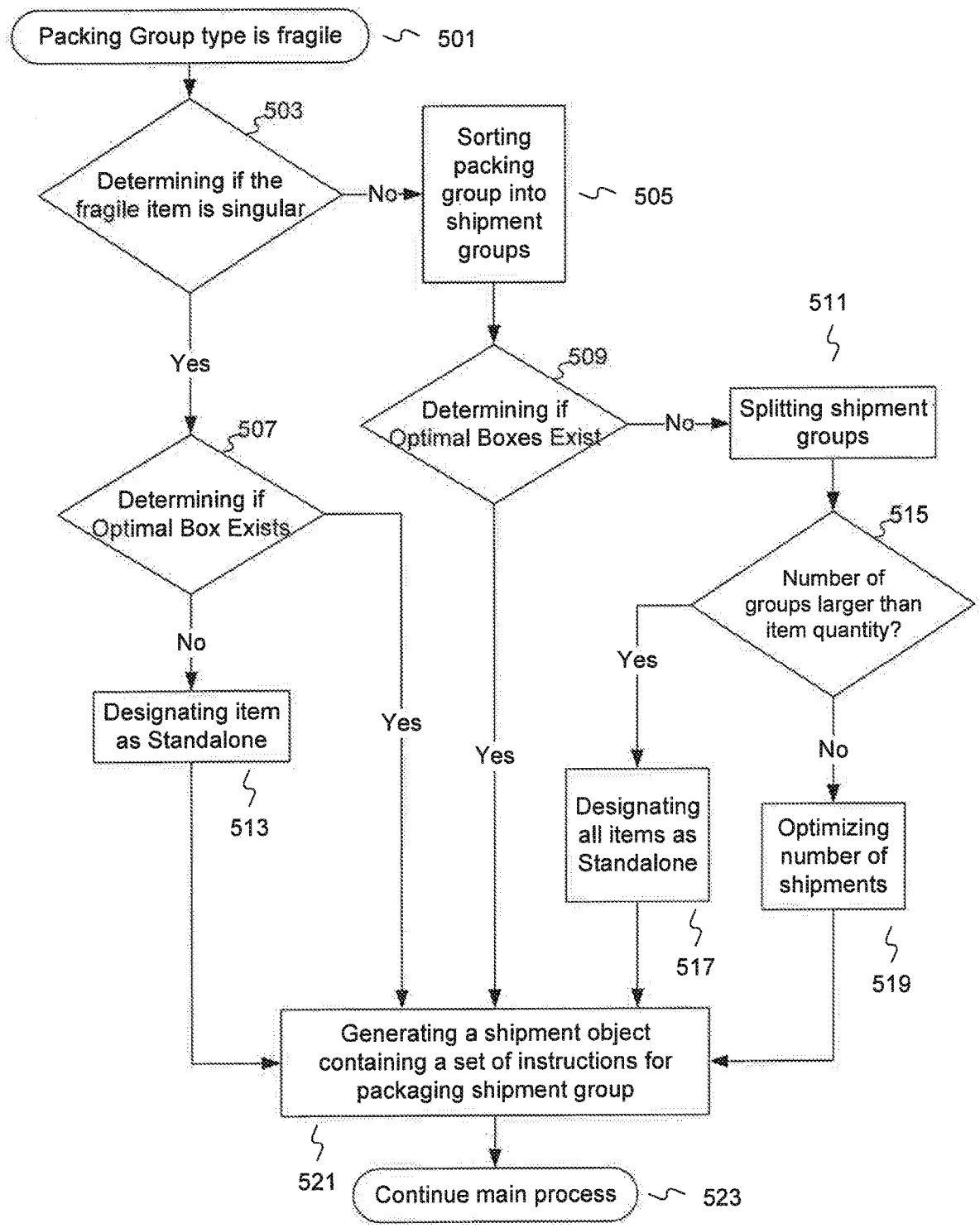
FIG. 5 is a flow chart illustrating an exemplary embodiment of a method for efficient packaging of ordered items when the packaging group is designated as fragile, consistent with the disclosed embodiments.

FIG. 5 illustrates a flow chart depicting the process 501 utilized by the FO system 113 for handling the fragile type items. After FO system 113 performs step 307 of main process FIG. 3 and the order items are sorted into the packing groups 307 one or more of the packing groups may be determined to be fragile and FO system 113 may begin process 501. The process 501 starts at step 503. In step 503, FO system 113 determines an amount of items in the packing group. If the item is singular the process 500 continues with step 507. In step 507, FO system 113 proceeds with determining if an optimal box exists for that item. If in step 507 FO system 113 determines that an optimal box does exist the process 501 proceeds to step 521, In step 521 the fragile item is packed by FO system 113 consistent with the earlier disclosure. If it is determined by the FO system 113 that there is no optimal box the fragile item the process 501 continues to step 513. In step 513, FO system 113, flags that item as standalone and may pack it separately.

Packaging of the fragile items may involve additional steps not depicted on the exemplary flow chart depicting process 501 performed by FO system 113. For example fragile items may be prepackaged using additional packaging materials such as bubble wrap. If additional packaging material is used the item dimensions will be measured and updated for proper box assignment.

When FO system 113 determines in step 503 that the amount of fragile items is not singular (i.e., there is more than a single fragile item), the process 501 may continue to step 505. In step 505, FO system 113 sorts the packing group into shipment groups. The FO system 113 performs sorting into shipment groups step 505 based on the preset weight and dimension thresholds that may be preset based on a shipping vendor. In the sorting into the shipment group step 505, the FO system 113 also takes cost into consideration. For example, if it is cheaper to send two smaller packages instead of one large and heavy the choice will be made to favor cheaper alternative. If multiple shipping vendors are used, multiple thresholds may be set up to take into account differences in cost across all the available vendors.

After the FO system 113 sorted the packing group into one or more shipment groups in step 505 of the process 501. The process 501 continues to step 509. In step 509, the FO system 113 an optimal box is determined for the shipment group. After the step 509 the process 501 continues similarly to the earlier described steps following step 507, with additional that the instruction generated by the FO system 113 may contain additional information related to the packing order of the items, since in this case there is a plurality of fragile items and not just one items as produced by the FO system 113 in step 507.

If, however, the optimal box is not found by the FO system 113 in step 509 the 501 process continues with step 511. In step 511, the FO system 113 splits the shipment group into smaller groups. Splitting of the shipment groups in the step 511 by the FO system 113 may be as simple as splitting the group proportionally e.g. in halves, thirds, quarters, etc. In some embodiments, the splitting may be more complex, e.g., based on the items dimensions, cost, weight, or a combination thereof.

After the FO system 113 splits the shipment groups in step 511 the process 501 continues with step 515. In step 515, FO system 113 begins with comparison of the number of shipment groups and quantity of the items in the original shipment group takes place. If the FO system 113 in step 515 determines that the amount of new groups is the same as the amount of items in the original group all items the process 501 continues proceeds to step 517. In step 517, FO system 113 designates all items as standalone items. The process 501 will follow with step 521. In step 521, in some embodiments, FO system 113 will generate shipment objects in an identical manner to step 415.

If, however, the FO system 113 in step 515 determines that the number of items is larger than the number of groups the process 501 will process with step 519. In step 519, the FO system 113 performs optimization of the number of shipment takes place. The goal of the optimization step is to generate an optimal number of shipment that would minimize the cost while adhering to the packaging limitations described above and consistent with the disclosure. One example of the optimizing the number of shipment process by the FO system 113 in step 519 is shown in FIG. 6.

Figure 6:
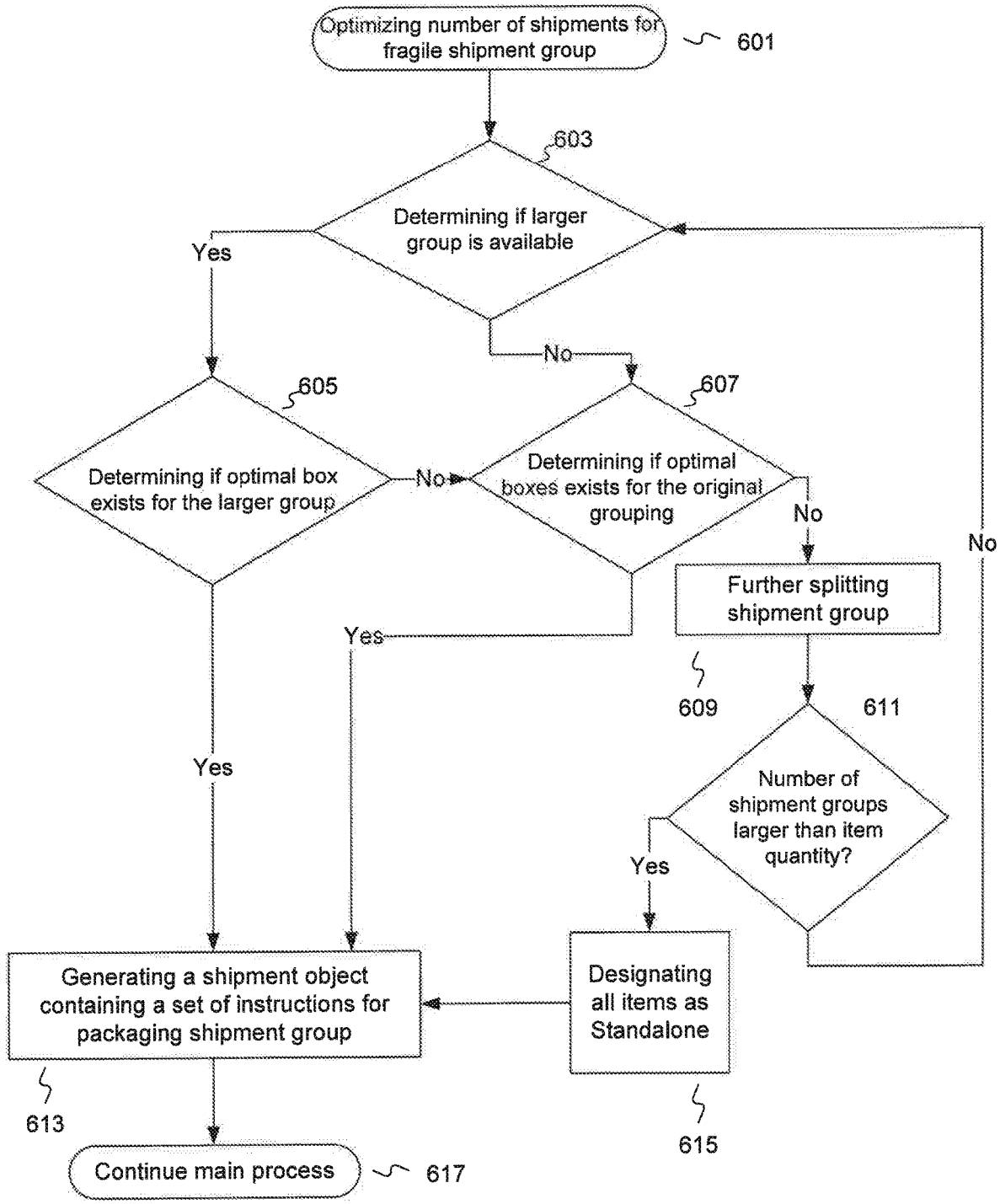
FIG. 6 is a flow chart illustrating an exemplary embodiment of a method for efficient packaging of ordered items, specifically a flow chart illustrating an exemplary method for optimizing a number of shipment for fragile shipment groups, consistent with the disclosed embodiments.

FIG. 6 illustrates a flow chart depicting an exemplary process of optimizing a number of shipments 601. Process 601 may begin in the situation when the FO system 113 determines that the number of items is larger than the number of groups (e.g. in step 515 of process 501 shown in FIG. 5). The process 601 begins with step 603. In step 603, the FO system 113, determines whether there is a possibility of creating a larger group after the split. For example, if the original group was split in equal halves but it is possible to split it to ⅓ and ⅔, ⅔ will be considered a larger group.

If FO system 113 determined that a larger group is available, the process 601 continues to step 605. In step 605, the FO system 113 attempts to find an optimal box for that group. And if the optimal box is found the process 601 and the FO system 113 proceed to generating a shipment object shown as step 613 and returning to the main process shown as step 617. Steps 613 and 617 are performed by the FO system 113 and are consistent with earlier disclosure.

If, however, the FO system 113 in step 603 determined that the larger group is not available. The process 601 continues with step 607. In step 607, the FO system 113 performs determination whether the optimal box exists for the original split group. If the FO system 113 determined in step 607 that there is an optimal box the process 601 is proceeding to generating a shipment object shown as step 613 and returning to the main process shown as step 617. Steps 613 and 617 are performed by the FO system 113 and performed, in some embodiments, identically to steps 521 and 523 (respectively).

If, however, the FO system 113 determined in step 607 that the optimal box is not found once again. The process 601 continues to step 609. In step 609, the FO system 113 splits the shipment group once more. The FO system 113 may perform step 609 identically or similarly to the earlier disclosed step 511 in process 501.

After the FO system 113 performs step 609 and the shipment group is split one more time, process 601 continues to step 611. In step 611, the FO system 113 is checking if the number of shipment groups is equal or larger than item quantity in the original group. And, if the FO system 113 determination is positive the process 601 continues to step 615. In step 615, the FO system 113 designates all items as standalone and proceeds as previously disclosed (e.g., with respect to steps 521 and 523) to generate a shipment object in step 613 and returning to the main process in step 617. If, however, the FO system 113 determines in step 611 that the number of shipment groups is not larger the process 601 returns to step 603 for the FO system 113 to adjust the grouping and repeat the process until all items are processed.

Optimal box determination steps depicted in FIG. 3-6, e.g. steps 311, 413, 507, 509, 605, 607 etc. may follow core algorithm outlined in the process 301 and FIG. 3 description. Each process is not limited to the specific set of steps and may comprise modifications, omissions and/or combinations of the core algorithm steps optimized to fit specifics of each subroutine.

Figure 7:
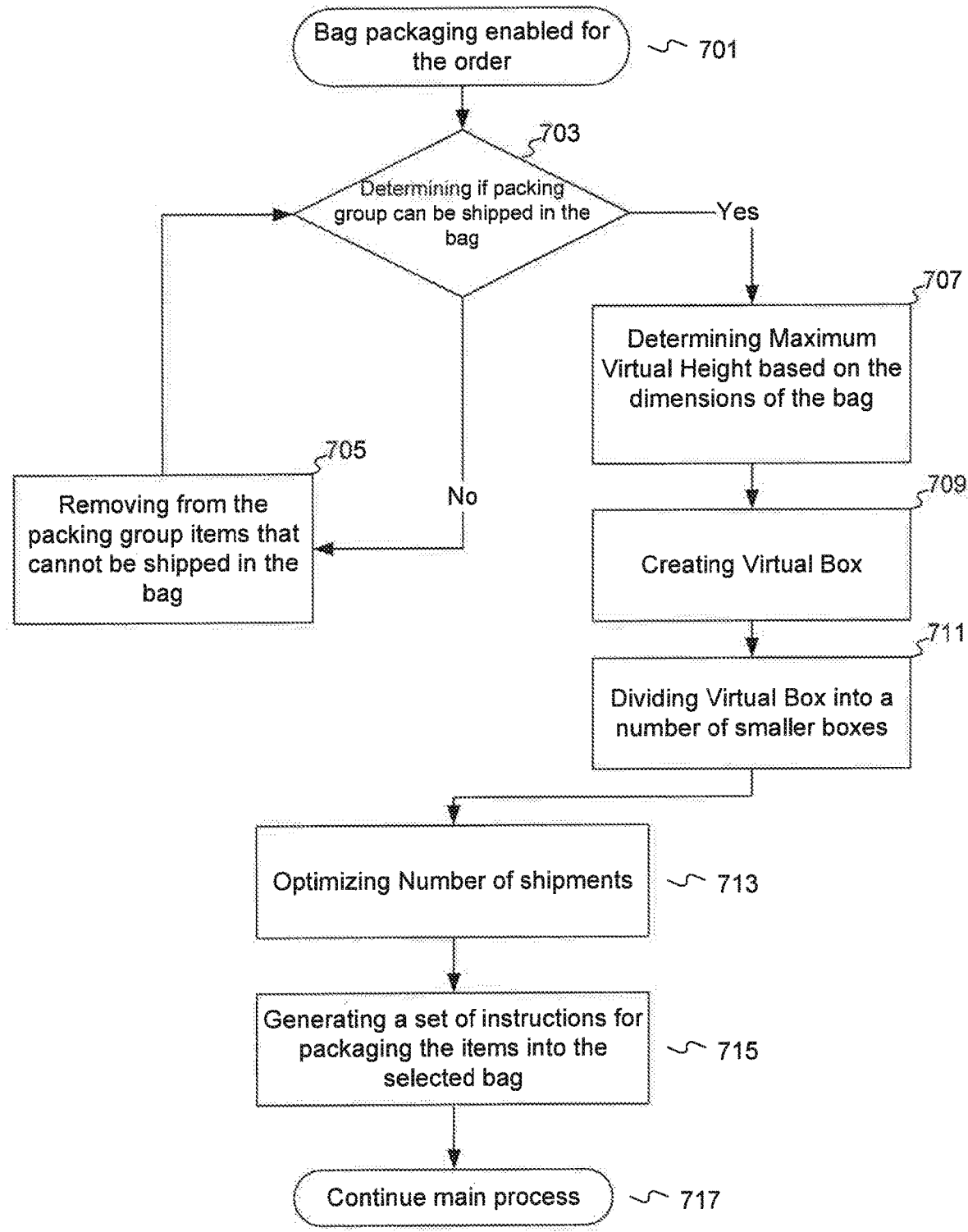
FIG. 7 is a flow chart illustrating an exemplary embodiment of a method for efficient packaging of ordered items when bag packaging is enabled for the order, consistent with the disclosed embodiments.

FIG. 7 depicts a flow chart illustrating a process for packing items into bags as well as boxes. Bags, in some embodiments, may comprise a soft package of predetermined volume, which can be made from plastic, paper, or other materials. One main challenge with bag packing is in choosing the best bag efficiently; unlike boxes, bags may deform in multiple dimensions when items are put in them. Process 701 starts at step 703. In step 703, the FO system 113 determines whether the packing group can be shipped in the bag. The determination of the step 703 performed by the FO system 113 may be performed based on characteristics of the items such as weight, dimensions, special flags or tags identifying availability of bag packaging, etc.

If the FO system 113 determines in step 703 that one or more items the packing group cannot be shipped in the bag the process 701 continues to step 705. In step 705, the FO system 113 may remove from the packing group items that cannot be shipped in the bag, until all the items in the group are eligible. If the FO system 113 determines in step 703 that all the items in the packing group are eligible to be shipped in one or more bags, process 701 proceeds with step 707. In step 707 the FO system 113 determines maximum virtual height based on the dimensions of the bag. For example, the maximum virtual height (vHeight) may be based on the width of the bag (bWidth) and the length of the bag (bLength). In some embodiments, it may be calculated as vHeight=9+(−2*(bLength+bWidth))+(bLength*bWidth)

After the FO system 113 determines the maximum virtual height in step 707 the process 701 proceeds to step 709. In step 709 the FO system 113 creates a virtual box. The virtual box comprises a digital representation of a plastic bag based on the dimensions of the bag, which are determined as follows: Virtual Box height=Plastic Bag height; Virtual Box width=Plastic Bag width−Virtual Box height; and Virtual Box length=Plastic Bag length−Virtual Box height.

A quadratic formula with particular coefficients (a=3, b=−2*(length+width), c=(length*width)) may be utilized to determine the "Maximum Virtual Height" of the bag—that is, the "maximum" height of the best approximation of the bag to a box. MaxVolumeHeight relates to determining the largest volume that can fit into a bag having a specific height.

The process 701 proceeds to step 711. In step 711, the FO system 113 may further divide the virtual box into a number of smaller boxes to allocate space for a possible plurality of items. The virtual box may be separated into a number of boxes to enable it to be used by boxing algorithms based on the size and the quantities of the items in the packing group. For example the virtual box may be separated into proportional sections and filled with items based on size (e.g. larger items will be put into a larger section and smaller items into smaller). Alternatively the virtual box may be split lengthwise into multiple sections of same size (e.g. eight sections) and each section filled with individual items of appropriate size. Wherein the appropriate size is determined based on the dimensions, weight, volume and other characteristics of the item.

The process 701 continues to step 713. In step 713 the FO system 113 optimizes the number of shipments to account for shipment costs and types of items shipped. Shipping items in bags may already be cheaper compared to conventional means (e.g., boxes), but further optimization may lead to additional savings. Further optimization may be achieved by taking into account vendor rates for various weight and size of the package (e.g. it may be cheaper to ship two light weight packages instead of one heavy weight). The optimization is consistent with the earlier disclosure and process 701.

The process 701 proceeds to step 715. In step 715, FO system 113 generates a shipment object and, in step 717, returns to main process 717. Steps 715 and 717 are performed by the FO system 113 and performed, in some embodiments, identically to steps 521 and 523 (respectively).

The packaging is simulated similarly to the box simulation. For example simulating may comprise determining dimensions of each item; determining the largest item of the group by determining an item with a longest dimension; simulating packing the largest item into the first bag; calculating remaining spaces in the first bag based by subtracting the dimensions of the largest item from the dimensions of the first package; and iteratively simulating packing at least one remaining item in the group into the calculated remaining spaces. And iteratively simulating packaging comprises iteratively simulating packaging the at least one item into a virtual box associated with the first bag, and the dimensions of the virtual box are calculated based on the virtual height of the first bag, the width of the first bag, and the length of the first bag.

Figure 8:
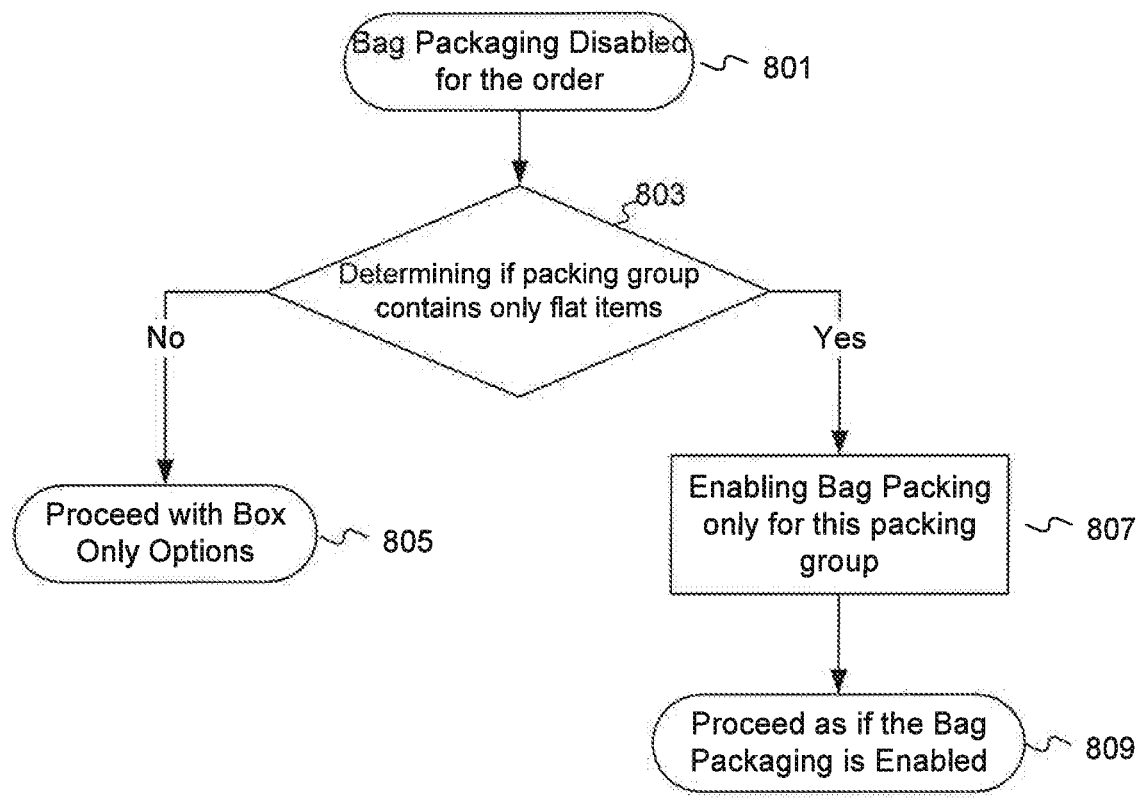
FIG. 8 is a flow chart illustrating an exemplary embodiment of a method for efficient packaging of ordered items when bag packaging is available, but is disabled for the order, consistent with the disclosed embodiments.

FIG. 8 depicts a flow chart illustrating a process 801 for overriding bag packaging in the event that all items in a packing group are flat items. Flat items are the items with one dimension significantly smaller than the others. An example of such flat items include books, magazines, records, photos, etc. If the bag packaging disabled for the order The process 801 begins with step 803. In step 803 the FO system 113 may override the setting by determining if packing group contains only flat items. If the FO system 113 determines that only flat items are present the process 801 proceeds with step 807. In step 807, the FO system 113 enables bag packing for that packing group only and the process 801 continues to step 809.

In step 809, the FO system 113 generates instructions for the order to be packed in the bag instead of the box.

If, however, FO system 113 determines (in step 803) that not only flat items are present in the packing group, process 801 continues to step 805. In step 805, the FO system 113 will behave as disclosed earlier and will proceed with the regular box packaging option.

While the present disclosure has been shown and described with reference to particular embodiments thereof, it will be understood that the present disclosure can be practiced, without modification, in other environments. The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, or other optical drive media.

Computer programs based on the written description and disclosed methods are within the skill of an experienced developer. Various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A computerized system for automated bag packaging, comprising:
    at least one processor; and
    at least one non-transitory storage medium comprising instructions that, when executed by the at least one processor, cause the at least one processor to perform steps comprising:
        receiving, from a remote system, an order comprising at least one item;
        searching, by the at least one processor, at least one data store to determine one or more properties associated with each item;
            performing, by the at least one processor, an optimization process for packaging the at least one item into one or more bags, by:
                selecting a data structure representing a first bag, the data structure comprising measurements of the first bag,
                iteratively simulating packaging of a largest item into the first bag until all items are packaged in the selected bag, by:
                    determining dimensions of each item,
                    determining the largest item by determining an item with a longest dimension,
                    simulating packing the largest item into the first bag,
                    calculating remaining spaces in the first bag based by subtracting the dimensions of the largest item from the dimensions of the first package, and
                    iteratively simulating packing at least one remaining item into the calculated remaining spaces; and
                generating at least one set of instructions for packaging the items into the selected bag; and
            sending, by the at least one processor, the generated instructions to a computer system for display, the instructions including at least one item identifier and one bag identifier.

2. The system of claim 1, wherein the size of the first bag comprises a width of the first bag (bWidth) and a length of the first bag (bLength).

3. The system of claim 2, wherein a maximum virtual height (vHeight) of the first bag is based on the width of the first bag (bWidth) and the length of the first bag (bLength).

4. The system of claim 3, wherein the maximum virtual height of the first bag (vHeight) is computed as $$vHeight=9+(-2(bLength+bWidth))+(bLength*bWidth).$$

5. The system of claim 4, wherein:
    iteratively simulating packaging comprises iteratively simulating packaging the at least one item into a virtual box associated with the first bag, and
    the dimensions of the virtual box are calculated based on the virtual height of the first bag, the width of the first bag, and the length of the first bag.

6. The system of claim 5, wherein the dimensions of the virtual box include a height, a width, and a length:
    the height of the virtual box is equal to the virtual height of the first bag;
    the width of the virtual box is equal to the width of the first bag less the virtual height; and
    the length of the virtual box is equal to the length of the first bag less the virtual height.

7. The system of claim 5, wherein:
    performing the optimization process further comprises dividing the virtual box into a number of equal-volume sub-boxes; and
    iteratively simulating packaging items into the one or more bags comprises iteratively simulating packaging items into the sub-boxes.

8. The system of claim 7, wherein the number of equal-volume sub-boxes comprises eight sub-boxes.

9. The system of claim 1, wherein if the simulating determines that the at least one item does not fit into the selected bag:
    choosing a larger bag, and
    iteratively computationally packaging the largest item until all items are packed in the larger bag.

10. A computer-implemented method for automated bag packaging, comprising:
    receiving, from a remote system, an order comprising at least one item;
    searching at least one data store to determine one or more properties associated with each item;
    performing an optimization process for packaging the at least one item into one or more bags, by:
        selecting a data structure representing a first bag, the data structure comprising measurements of the first bag,
        iteratively simulating packaging of a largest item into the first bag until all items are packaged in the selected bag,
        determining that the at least one item does not fit into the first bag,
        choosing a larger bag, and
        iteratively computationally packaging the largest item until all items are packed in the larger bag,
        generating at least one set of instructions for packaging the items into the larger bag; and
    sending the generated instructions to a computer system for display, the instructions including at least one item identifier and one bag identifier.

11. The computer-implemented method of claim 10, wherein the size of the first bag comprises a width of the first bag (bWidth) and a length of the first bag (bLength).

12. The computer-implemented method of claim 11, wherein a maximum virtual height (vHeight) of the first bag is based on the width of the first bag (bWidth) and the length of the first bag (bLength).

13. The computer-implemented method of claim 12, wherein the maximum virtual height of the first bag (vHeight) is computed as $$vHeight=9+(-2*(bLength+bWidth))+(bLength*bWidth).$$

14. The computer-implemented method of claim 13, wherein:
iteratively simulating packaging comprises iteratively simulating packaging the at least one item into a virtual box associated with the first bag, and
the dimensions of the virtual box are calculated based on the virtual height of the first bag, the width of the first bag, and the length of the first bag.

15. The computer-implemented method of claim 14, wherein the dimensions of the virtual box include a height, a width, and a length:
the height of the virtual box is equal to the virtual height of the first bag;
the width of the virtual box is equal to the width of the first bag less the virtual height; and
the length of the virtual box is equal to the length of the first bag less the virtual height.

16. The computer-implemented method of claim 14, wherein:
performing the optimization process further comprises dividing the virtual box into a number of equal-volume sub-boxes; and
iteratively simulating packaging items into the one or more bags comprises iteratively simulating packaging items into the sub-boxes.

17. The computer-implemented method of claim 10 further comprises:
determining dimensions of each item;
determining the largest item by determining an item with a longest dimension;
simulating packing the largest item into the first bag;
calculating remaining spaces in the first bag based by subtracting the dimensions of the largest item from the dimensions of the first package; and
iteratively simulating packing at least one remaining item into the calculated remaining spaces.

18. A computer-implemented system for automated bag packaging, comprising:
receiving, from a remote system, an order comprising at least one item;
searching at least one data store to determine one or more properties associated with each item;
performing an optimization process for packaging the at least one item into one or more bags, by:
selecting a data structure representing a first bag, the data structure comprising measurements of the first bag, wherein:
the size of the first bag comprises a width of the first bag (bWidth) and a length of the first bag (bLength), and
a maximum virtual height of the first bag (vHeight) is computed as: vHeight=9+(−2*(bLength+bWidth))+(bLength*bWidth); and
iteratively simulating packaging of a largest item of the group into the first bag until all items are packaged in the selected bag;
generating at least one set of instructions for packaging the items into the selected bag; and
sending the generated instructions to a computer system for display, the instructions including at least one item identifier and one bag identifier.

\* \* \* \* \*

UNITED STATES PATENT AND TRADEMARK OFFICE
CERTIFICATE OF CORRECTION

PATENT NO. : 10,705,488 B1
APPLICATION NO. : 16/576083
DATED : July 7, 2020
INVENTOR(S) : Xiaohua Cui, Zhijun Xu and Rubin Zhao Page 1 of 1

It is certified that error appears in the above-identified patent and that said Letters Patent is hereby corrected as shown below:

In the Claims

Claim 4, Column 19, Line 66:
"vHeight=9+(-2(bLength+bWidth))+"
Should read:
-- vHeight=9+(-2*(bLength+bWidth))+ --.

Claim 18, Column 22, Lines 23-24:
"packaging of a largest item of the group into the first bag"
Should read:
-- packaging of a largest item into the first bag --.

Signed and Sealed this
First Day of September, 2020

Andrei Iancu
*Director of the United States Patent and Trademark Office*